United States Patent [19]
Mukai

[11] Patent Number: 5,563,082
[45] Date of Patent: Oct. 8, 1996

[54] METHOD OF MANUFACTURING A XMOS INSULATED TRANSISTOR

[75] Inventor: Mikio Mukai, Kanagawa, Japan

[73] Assignee: Sony Corporation, Tokyo, Japan

[21] Appl. No.: 362,919

[22] Filed: Dec. 23, 1994

[30] Foreign Application Priority Data

Dec. 27, 1993 [JP] Japan ................................. 5-333576

[51] Int. Cl.$^6$ .................. H01L 21/265; H01L 21/20; H01L 21/76; H01L 21/302

[52] U.S. Cl. .................. 437/41; 437/62; 437/86; 437/974

[58] Field of Search .................. 437/974, 40, 41, 437/47, 52, 62, 235, 41 GS, 40 GS, 86; 257/623, 624, 625, 626; 148/DIG. 135

[56] References Cited

U.S. PATENT DOCUMENTS

| | | | |
|---|---|---|---|
| 3,200,468 | 8/1965 | Dahlberg | 437/974 |
| 4,979,014 | 12/1990 | Hieda et al. | 357/56 |
| 5,102,819 | 4/1992 | Matsushita et al. | 437/52 |
| 5,120,666 | 6/1992 | Gotou | 437/40 |
| 5,177,027 | 1/1993 | Lowrey et al. | 437/41 |
| 5,315,143 | 5/1994 | Tsuji | 257/401 |
| 5,376,559 | 12/1994 | Mukai et al. | 437/41 |

*Primary Examiner*—Mary Wilczewski
*Assistant Examiner*—Brian K. Dutton
*Attorney, Agent, or Firm*—Hill, Steadman & Simpson

[57] ABSTRACT

A method of manufacturing a lateral insulated gate field effect transistor comprises the steps of forming a projecting portion on a first major surface of a semiconductor substrate, forming a pair of gate portions each of which is formed in each side of the projecting portion, forming an insulating layer on the resulting surface of the semiconductor substrate by burying the projecting portion and the pair of gate portions, and removing the semiconductor substrate from a second major surface of the semiconductor substrate to a position of the insulating layer in which the projecting portion is buried to expose the bottom surface of the projecting portion.

6 Claims, 6 Drawing Sheets

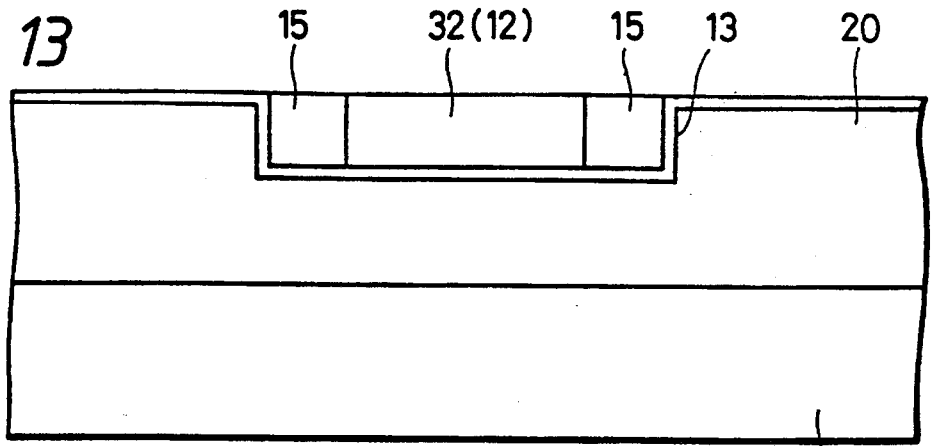
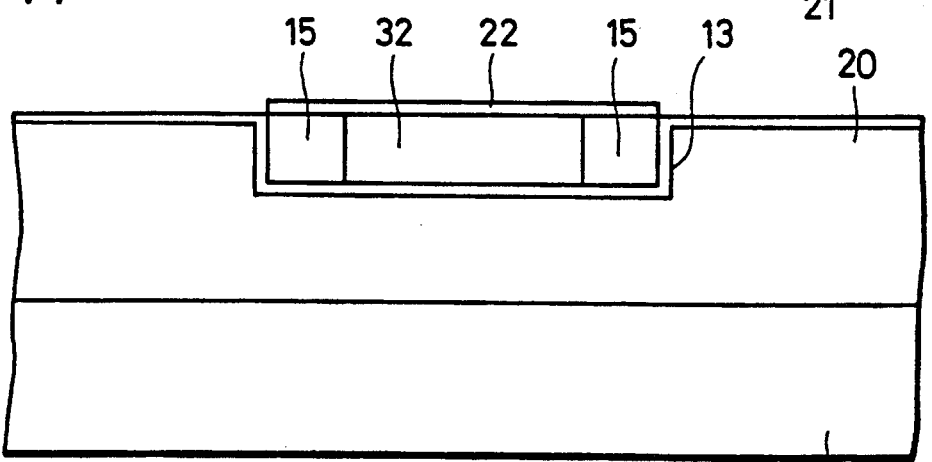
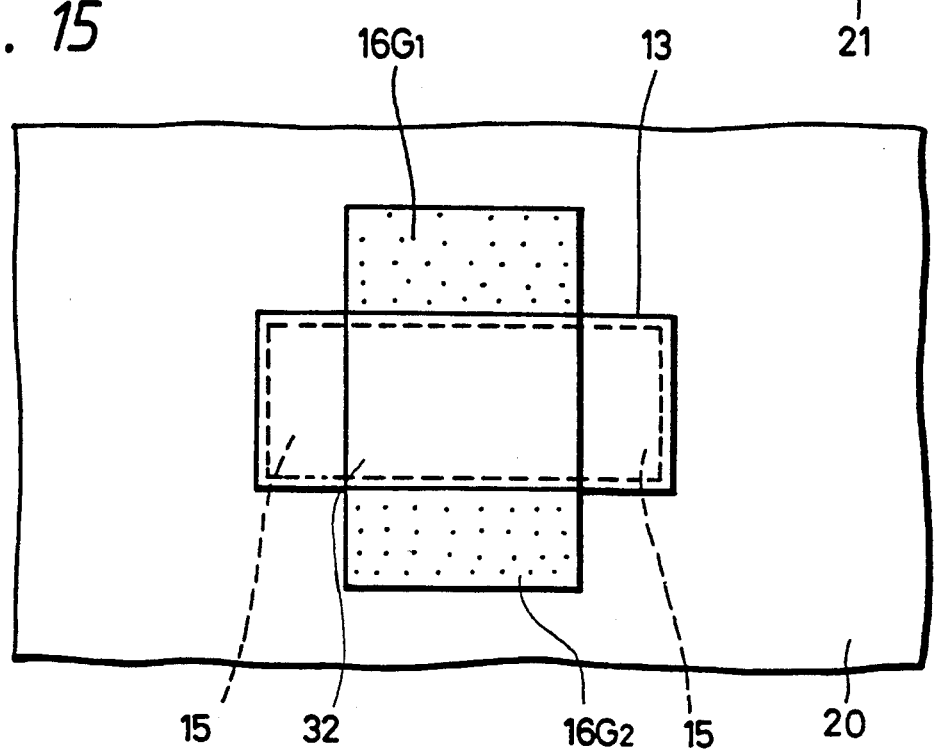

5,563,082

METHOD OF MANUFACTURING A XMOS INSULATED TRANSISTOR

BACKGROUND OF THE INVENTION

The present invention relates to a method of manufacturing a lateral insulated gate field effect transistor and particularly to a method of manufacturing a so-called XMOS transistor in which a pair of gate portions are formed on a channel forming portion of a semiconductor layer in an opposing relation to each other.

FIG. 1 of the accompanying drawings shows a fundamental arrangement of an XMOS transistor. As shown in FIG. 1, gate portions with first and second gate electrodes $3G_1$, $3G_2$ are disposed across a semiconductor layer 1 of low impurity concentration, i.e. p- or n- or intrinsic i type serving as a channel forming portion through a gate insulating layer 2 in an opposing relation to each other. Source and drain regions 4 are formed on both sides of the disposed portion of the pair of gate portions of the semiconductor layer 1 by implanting ions of n- or p-type impurity.

The thus arranged transistor has various features such that it is free from punchthrough, excellent in switching characteristics, characteristics can be controlled without introducing impurity into the channel region and that freedom in control operation is large because control voltages can be independently applied to the gate electrodes $3G_1$, $3G_2$.

In the XMOS transistor, a part of the semiconductor layer 1 is brought in contact with a single crystal substrate or the like and formed by solid phase epitaxial growth in the surface direction. Therefore, the semiconductor layer 1 with satisfactory crystallinity cannot be formed and a transistor having high carrier mobility cannot be realized under the present condition.

SUMMARY OF THE INVENTION

It is therefore an object of the present invention to provide a method of manufacturing a lateral insulated gate field effect transistor having sufficiently high carrier mobility, excellent switching characteristic and excellent frequency characteristic.

According to an aspect of the present invention, there is provided a method of manufacturing a lateral insulated gate field effect transistor which comprises the steps of forming a projecting portion on a first major surface of a semiconductor substrate, forming a pair of gate portions each of which is formed in each side of the projecting portion, forming an insulating layer on the resulting surface of the semiconductor substrate by burying the projecting portion and the pair of gate portions and removing the semiconductor substrate from a second major surface of the semiconductor substrate to a position of the insulating layer in which the projecting portion is buried to expose the bottom surface of the projecting portion.

BRIEF DESCRIPTION OF THE DRAWINGS

FIG. 13 is a cross-sectional view showing a process of the manufacturing method according to the embodiment of the present invention;

FIG. 14 is a cross-sectional view showing a process of the manufacturing method according to the embodiment of the present invention; and FIG. 15 is a cross-sectional view showing a process of the manufacturing method according to the embodiment of the present invention.

DETAILED DESCRIPTION OF THE PREFERRED EMBODIMENT

A manufacturing method according to an embodiment of the present invention will hereinafter be described with reference to the drawings.

Figure 1:
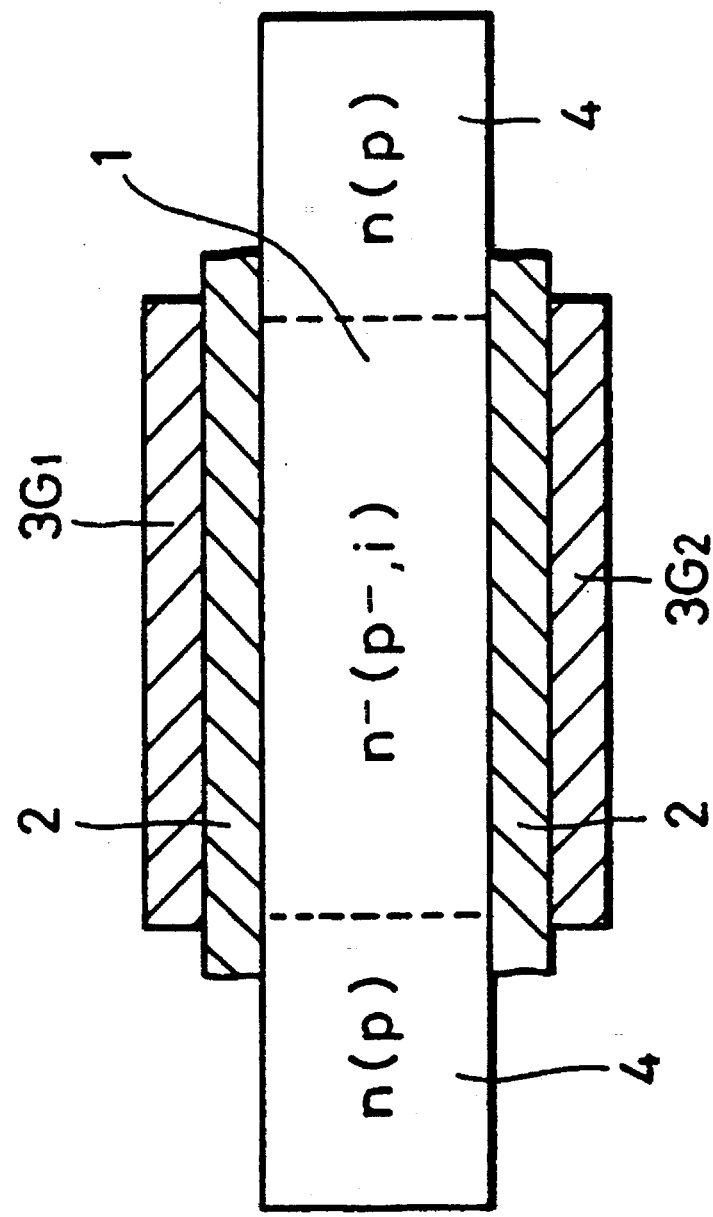
FIG. 1 is a schematic cross-sectional view showing a fundamental arrangement of a conventional XMOS transistor.
Figure 2:
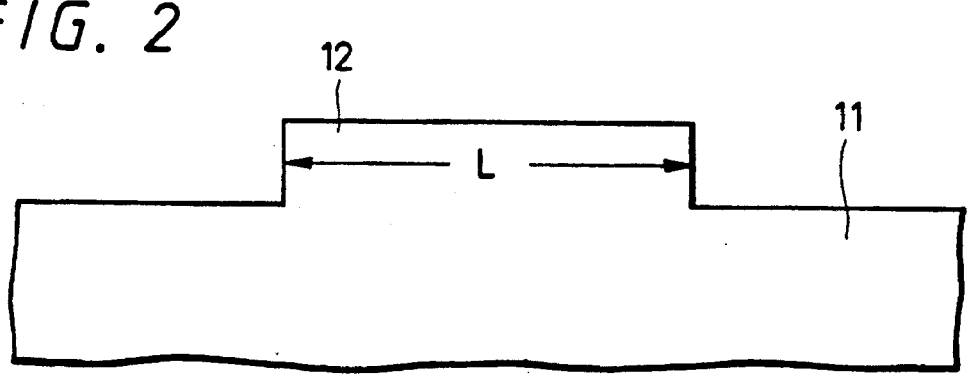
FIG. 2 is a cross-sectional view showing a process of a manufacturing method according to an embodiment of the present invention.

According to the present invention, as shown in FIG. 2, there is prepared a semiconductor substrate 11 formed of a silicon (Si) single crystal substrate. In a first process, a projecting portion 12 of a rectangular pattern having a predetermined length L is formed on a first major surface of the semiconductor substrate 11. The projecting portion 12 is formed such that an etching resist of a rectangular pattern is formed on the semiconductor substrate 11 by a suitable method, such as photolithography or the like and the surrounding portion of the projecting portion 12 is etched away with a predetermined depth by dry etching, such as RIE (reactive ion etching) or chemical etching.

Figure 3:
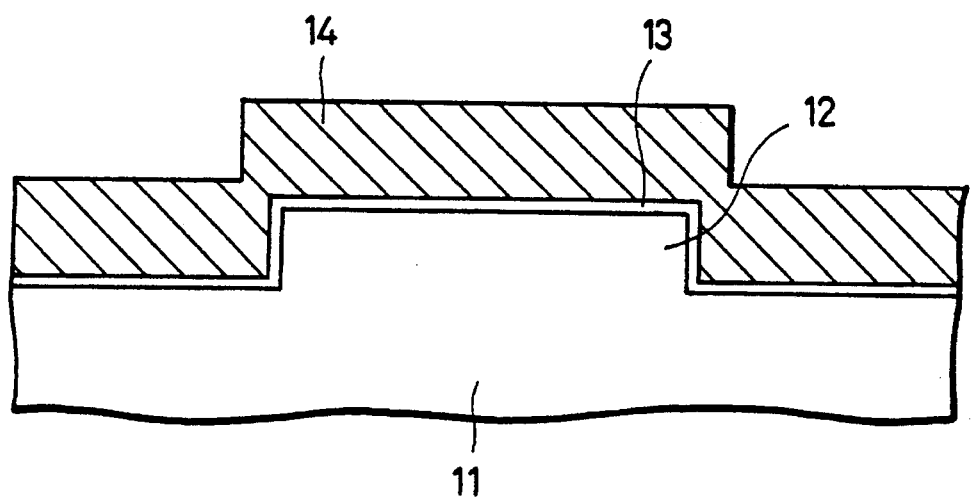
FIG. 3 is a cross-sectional view showing a process of the manufacturing method according to the embodiment of the present invention.

In the next process, gate portions are formed on both side portions of the projecting portion 12. To this end, as shown in FIG. 3, an insulating layer 13 which finally forms a gate insulating layer is formed on the semiconductor substrate 11 so as to cover the surface of the semiconductor substrate 11 on its side in which the projecting portion 12 is formed, particularly, the surface of the projecting portion 12 by surface thermal oxidation. Then, a photoresist 14 is coated on the whole surface of the semiconductor substrate 11 through the insulating layer 13.

Figure 4:
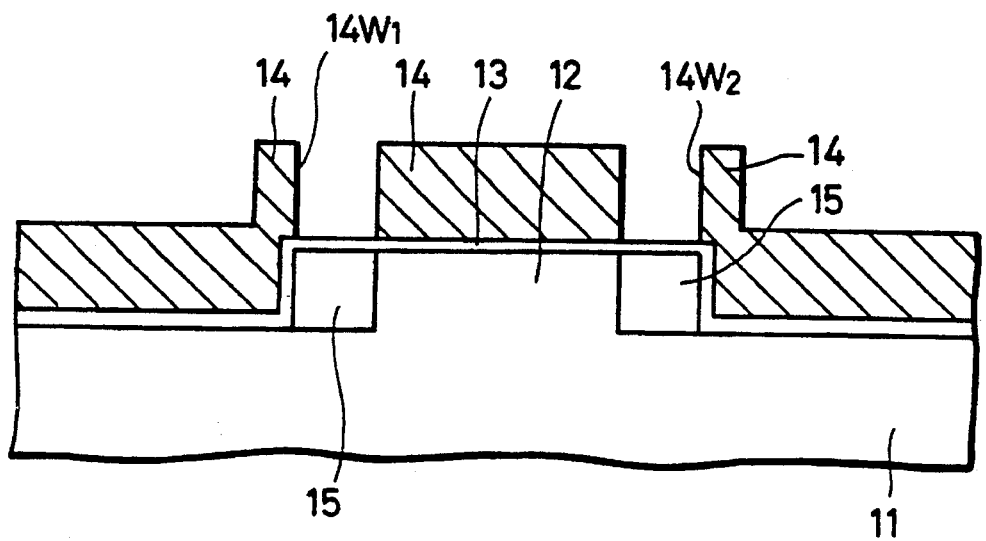
FIG. 4 is a cross-sectional view showing a process of the manufacturing method according to the embodiment of the present invention.

Then, as shown in FIG. 4, the photoresist 14 is exposed in pattern and developed to thereby form openings $14W_1$, $14W_2$ on the projecting portion 12 at its both ends in the length L direction. The photoresist 14 is used as a mask and source and drain regions 15 are respectively formed through the openings $14W_1$ and $14W_2$ by implanting ions of n- or p-type impurity.

Figure 5:
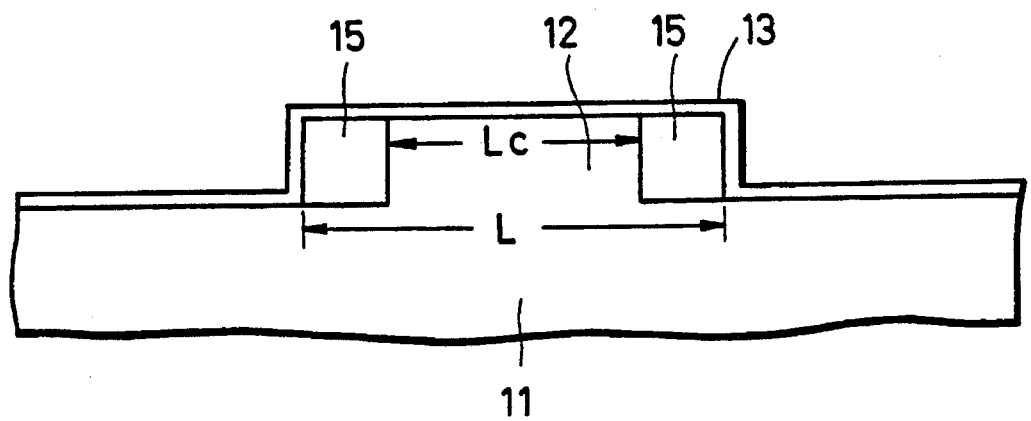
FIG. 5 is a cross-sectional view showing a process of the manufacturing method according to the embodiment of the present invention.

Thereafter, as shown in FIG. 5, the photoresist 14 is removed. In this case, a spacing Lc between the two regions 15 is selected in response to a channel length of a target transistor.

Figure 6:
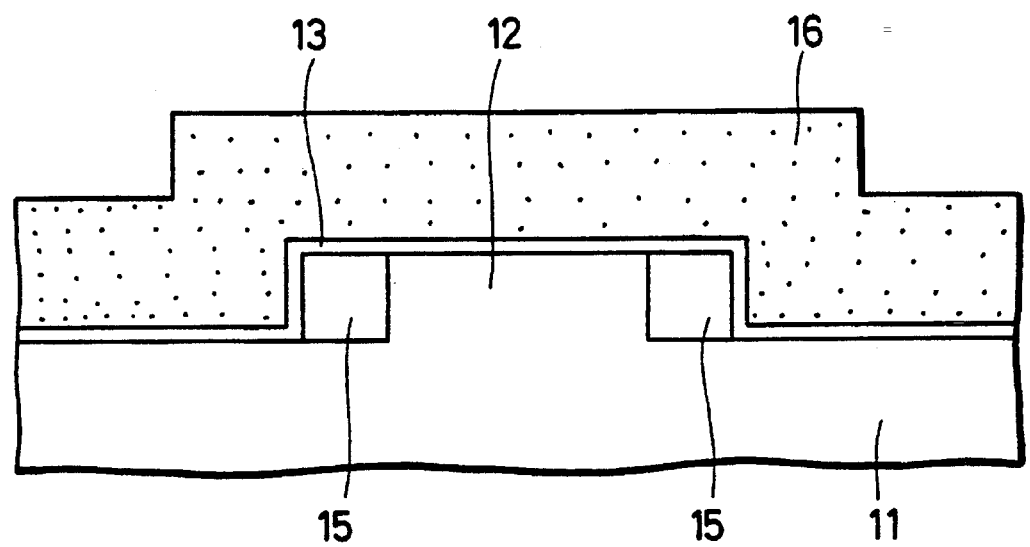
FIG. 6 is a cross-sectional view showing a process of the manufacturing method according to the embodiment of the present invention.

Then, as shown in FIG. 6, the projecting portion 12 is buried and a conductive layer 16 which finally constructs a gate electrode is formed by processing impurity-doped polycrystalline silicon of low resistivity according to CVD (chemical vapor deposition).

Figure 7:
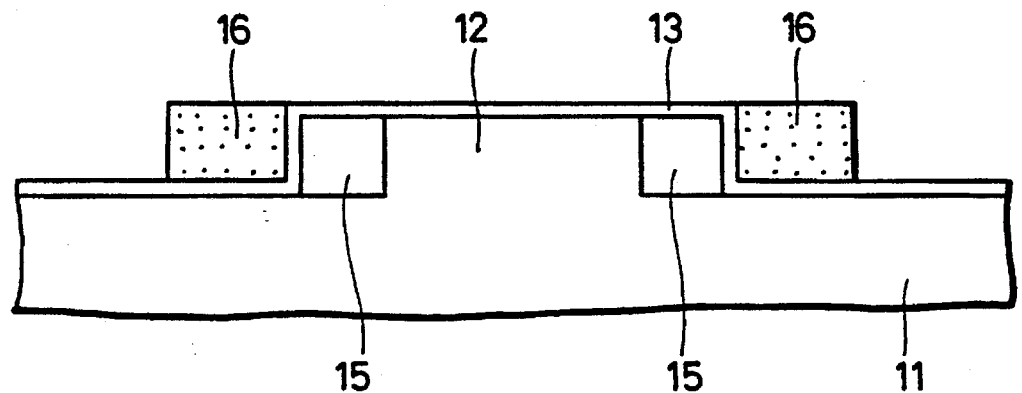
FIG. 7 is a cross-sectional view showing a process of the manufacturing method according to the embodiment of the present invention.

As shown in FIG. 7, the conductive layer 16 is treated by so-called etchback based on anisotropy etching presenting etching characteristic in the vertical direction relative to the upper surface of the projecting portion 12 to thereby remove other portions than the conductive layer 16 in a square annular pattern left at the outer peripheral portion of the projecting portion 12.

Figure 8:
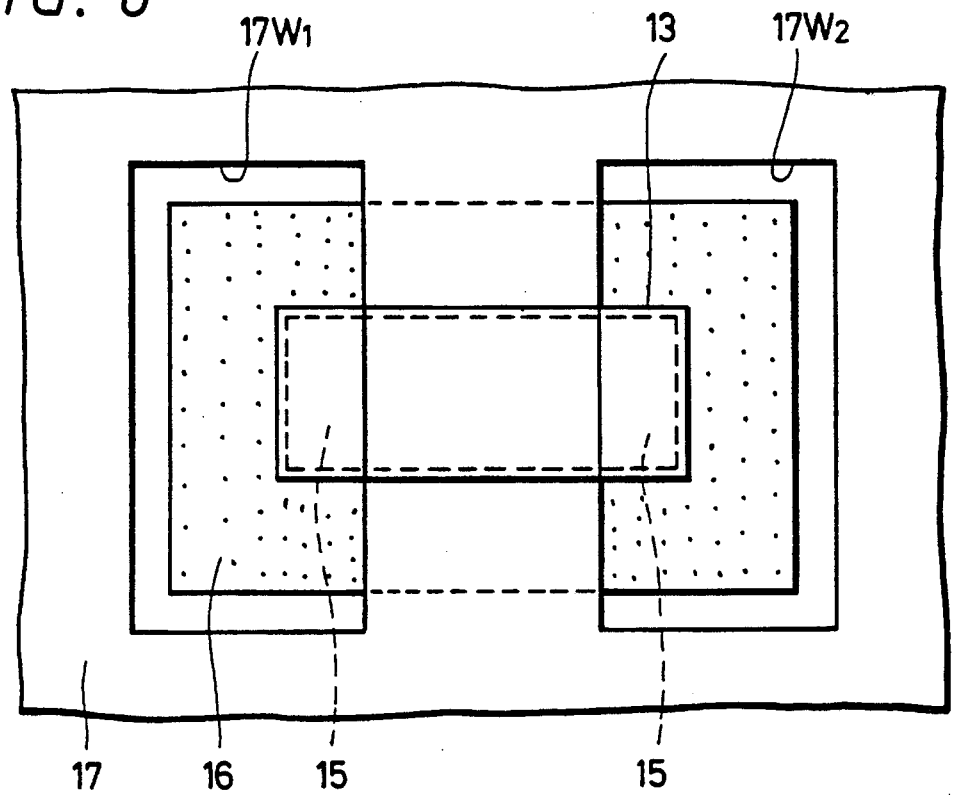
FIG. 8 is a plan view showing a process of the manufacturing method according to the embodiment of the present invention.

As shown in a plan view of FIG. 8, a resist 17 is deposited on the semiconductor substrate 11. The resist 17 is made of photoresist, for example, and shaped by predetermined pattern exposure and development in a pattern such that the portions placed between the source and drain regions 15 of the conductive layer 16 are covered and the first and second openings $17W_1$, $17W_2$ are formed at both sides of the source and drain regions 15.

Figure 9:
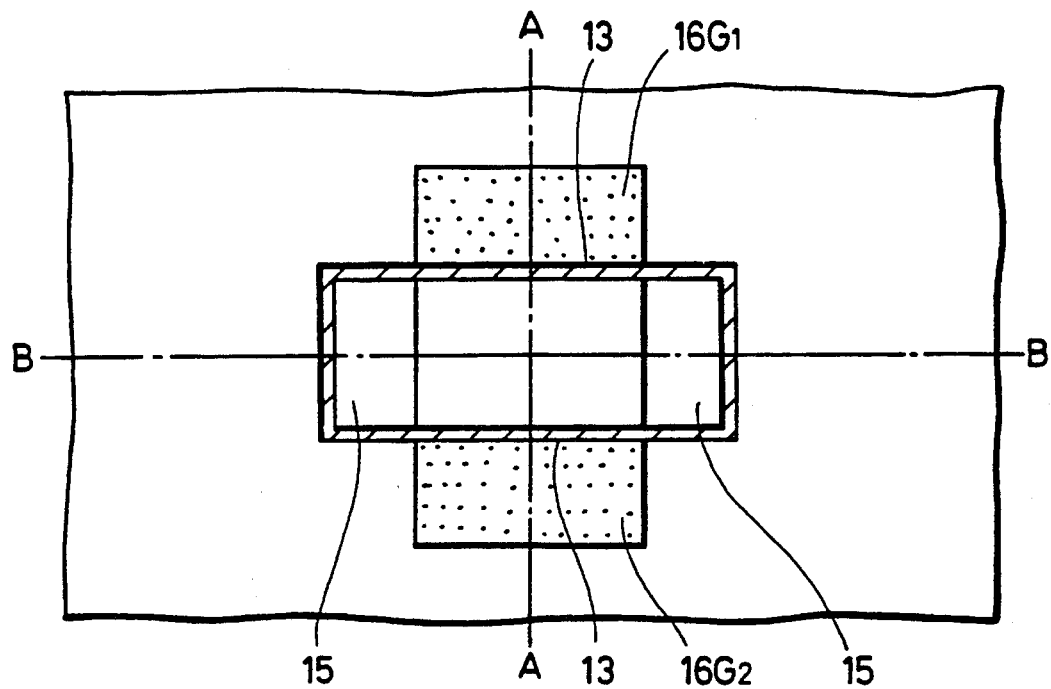
FIG. 9 is a cross-sectional view showing a process of the manufacturing method according to the embodiment of the present invention.
Figure 10:
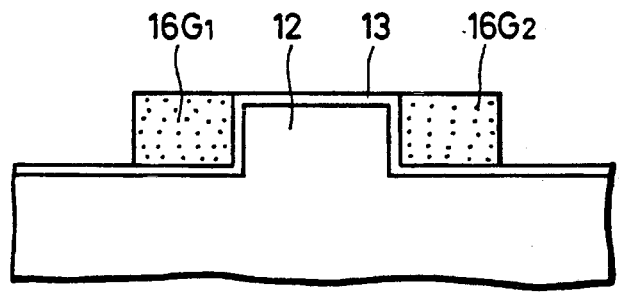
FIG. 10 is a cross-sectional view taken along the line A—A in FIG. 9.
Figure 11:
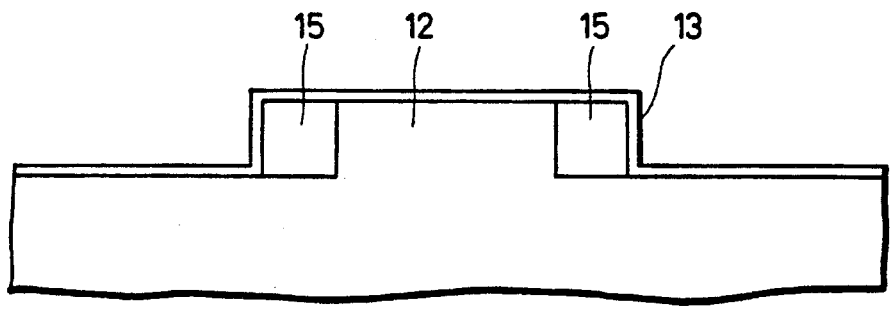
FIG. 11 is a cross-sectional view taken along the line B—B in FIG. 9.

The resist 17 is used as the etching mask and the conductive layer 16 is etched away through the openings $17W_1$, $17W_2$ to thereby form through the insulating layer 13 gate electrodes $16G_1$, $16G_2$ based on the conductive layer 16 on the projecting portion 12 at its respective side surfaces of the portions in which the source and drain regions 15 are formed. Thereafter, as shown in FIG. 9 which is a partly cross-sectional plan view, the resist 17 is removed. FIGS. 10 and 11 are cross-sectional views taken along the line A—A and the line B—B in FIG. 9 respectively.

Respective edge portions of the gate electrodes $16G_1$, $16G_2$ should preferably be agreed with opposing end portions of the source and drain regions 15. According to the aforementioned method, when the openings $17W_1$, $17W_2$ of the resist 17 serving as the etching mask are positionally displaced so that the respective edge portions are not agreed, i.e., offset, it is possible to prevent a spacing from being produced at least among the source and drain regions 15 and the gate electrodes $16G_1$, $16G_2$ by implanting ions with low implanting energy as compared with ion implantation energy previously used when ions of impurity are implanted again with the resist 17 serving as the mask.

In some cases, the source and drain regions 15 need not be formed in the process shown in FIG. 4 but the source and drain regions 15 can be formed through the conductive layer 16 made of polycrystalline silicon (Si) by implanting ions through the openings $17W_1$, $17W_2$ of the resist 17 shown in FIG. 8. Alternatively, after the gate electrodes $16G_1$, $16G_2$ are formed, i.e., under the condition that the conductive layer 16 is removed in the openings $17W_1$ and $17W_2$, it is possible to form the source and drain regions 15 by implanting ions.

Figure 12:
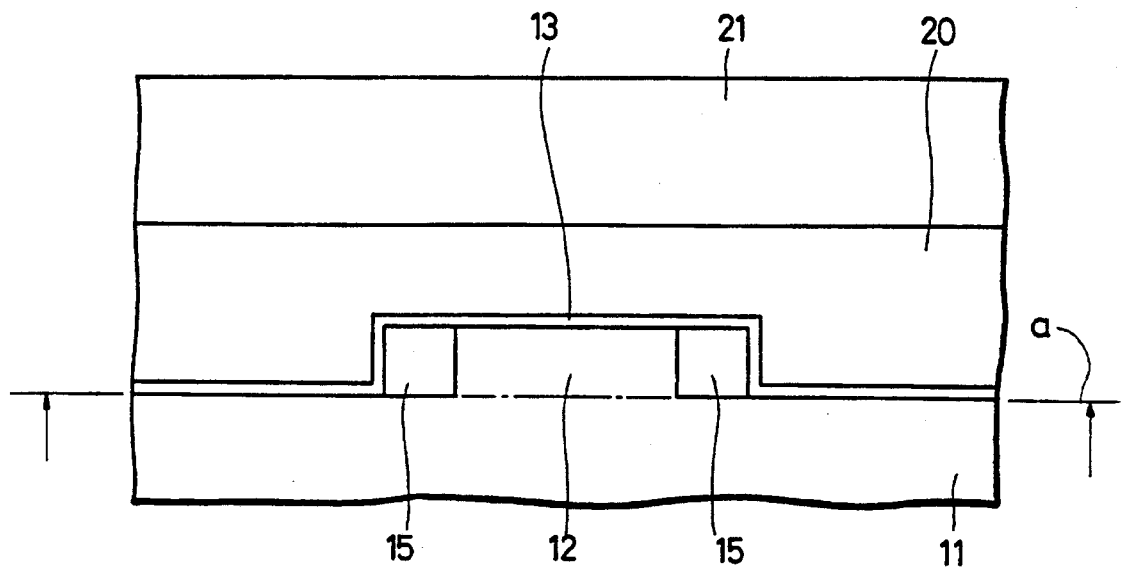
FIG. 12 is a cross-sectional view showing a process of the manufacturing method according to the embodiment of the present invention.

Thereafter, as shown in FIG. 12, in the next process, the gate portions having the two gate electrodes $16G_1$, $16G_2$ are buried and an insulating layer 20, such as TEOS (tetraethylorthosilicate) or the like is formed on the whole surface of the semiconductor substrate 11. Further, a substrate 21, e.g., semiconductor substrate such as silicon or the like is bonded to the insulating layer 20.

Then, as shown in FIG. 12, the semiconductor substrate 11 is polished up to a position shown by a straight line a in FIG. 12 from the rear surface, i.e., a second major surface by chemical mechanical polishing so that the projecting portion 12, i.e., a part of the single crystal semiconductor substrate 11 of the early stage is left as a semiconductor layer 32 of the channel forming portion. Other portions are removed.

As shown in FIG. 14, the insulating layer 22, such as an $SiO_2$ layer or the like is formed on the semiconductor layer 32 at its surface exposed to the outside by a suitable method, such as CVD, thermal oxidation or the like. Thus, as shown in a plan view of FIG. 15, there is constructed a target lateral insulated gate field effect transistor having a pair of gate portions in which the source and drain regions 15 are formed on both ends of the semiconductor layer 32 and the first and second gate electrodes $16G_1$, $16G_2$ are formed at the respective outside portions of the semiconductor layer 32 formed between the two source and drain regions 15 as the channel forming portion through the gate insulating layer 13.

According to the method of the present invention, since the lateral insulated gate field effect transistor is formed by the semiconductor substrate 11 in the early stage, i.e., the semiconductor layer 32 is made of single crystal, it is possible to obtain the target lateral insulated gate field effect transistor, i.e., XMOS transistor having high carrier mobility and excellent characteristics.

According to the manufacturing method of the present invention, since the semiconductor layer forming the transistor is formed by the semiconductor substrate itself, it is possible to form a target lateral insulated gate field effect transistor having excellent crystallinity, accordingly, high carrier mobility.

Further, according to the present invention, since the pair of gates are formed simultaneously, the positioning of the two gates can be carried out accurately.

Furthermore, since the pair of gates are formed on the same surface side of the source and drain regions, interconnection layers can be disposed on the pair of gates with large freedom and interconnection can be led out with ease, which is extremely advantageous when transistors are formed as integrated circuits.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A method of manufacturing a lateral insulated gate field effect transistor comprising the steps of:

forming a projecting portion on a first major surface of a semiconductor substrate;

forming source and drain regions by using a mask formed on said first major surface;

forming a pair of gate portions each of which is formed adjacent said projecting portion;

forming an insulating layer on the resulting surface of said semiconductor substrate by burying said projecting portion, said source and drain regions and said pair of gate portions; and removing a portion of said semiconductor substrate from a second major surface of said semiconductor substrate to a position of said insulating layer in which said projecting portion is buried to expose a bottom surface of said projecting portion.

2. The method as defined in claim 1, wherein said semiconductor substrate is a silicon single crystal substrate.

3. The method as defined in claim 1, wherein said pair of gate portions are formed simultaneously.

4. The method as defined in claim 1, wherein said pair of gate portions are formed on the same surface as said source and drain regions.

5. The method as defined in claim 1, wherein said remaining step includes chemical mechanical polishing.

6. The method as defined in claim 1, further comprising the step of applying an insulating layer to said exposed bottom surface of said projecting portion.

\* \* \* \* \*